United States Patent
Kiener

(10) Patent No.: US 10,477,727 B2
(45) Date of Patent: Nov. 12, 2019

(54) TEMPERATURE-CONTROL UNIT FOR AN ELECTRONIC COMPONENT

(71) Applicant: Siemens Healthcare GmbH, Erlangen (DE)

(72) Inventor: Christoph Kiener, Munich (DE)

(73) Assignee: SIEMENS HEALTHCARE GMBH, Erlangen (DE)

( * ) Notice: Subject to any disclaimer, the term of this patent is extended or adjusted under 35 U.S.C. 154(b) by 154 days.

(21) Appl. No.: 15/673,572

(22) Filed: Aug. 10, 2017

(65) Prior Publication Data

US 2018/0049347 A1 Feb. 15, 2018

(30) Foreign Application Priority Data

Aug. 11, 2016 (DE) .......................... 10 2016 214 959

(51) Int. Cl.
| | | |
|---|---|---|
| *H05K 7/20* | (2006.01) | |
| *B33Y 10/00* | (2015.01) | |
| *B33Y 50/02* | (2015.01) | |

(52) U.S. Cl.
CPC ..... *H05K 7/20327* (2013.01); *H05K 7/20254* (2013.01); *B33Y 10/00* (2014.12); *B33Y 50/02* (2014.12)

(58) Field of Classification Search
CPC .............. H01L 23/4735; H01L 23/473; H01L 23/4336; H01L 23/467; H05K 7/20327; H05K 7/20772; H05K 7/20172; H05K 7/20254; H05K 7/20281; H05K 7/20836
See application file for complete search history.

(56) References Cited

U.S. PATENT DOCUMENTS

| | | | | | |
|---|---|---|---|---|---|
| 5,021,924 | A | * | 6/1991 | Kieda ................ | H01L 23/4336 165/104.33 |
| 5,177,667 | A | * | 1/1993 | Graham .............. | H01L 23/4336 257/714 |
| 5,316,075 | A | | 5/1994 | Quon ........................... | 165/80.4 |
| 5,365,400 | A | * | 11/1994 | Ashiwake ............. | H01L 23/433 165/80.4 |
| 5,959,351 | A | * | 9/1999 | Sasaki ....................... | F15D 1/08 257/714 |

(Continued)

FOREIGN PATENT DOCUMENTS

| | | | | |
|---|---|---|---|---|
| DE | 10 2008 035 252 | | 7/2008 | .......... H01L 23/433 |
| DE | 102008035252 A1 | | 2/2009 | .......... G91K 23/433 |

(Continued)

OTHER PUBLICATIONS

German Office Action, Application No. 102016214959.8, 6 pages, dated Apr. 7, 2017.

*Primary Examiner* — Adam B Dravininkas
(74) *Attorney, Agent, or Firm* — Slayden Grubert Beard PLLC

(57) ABSTRACT

The present disclosure relates to heat and temperature control. The teachings thereof may be embodied in temperature-control units for electronic components. For example, a temperature-control unit may include: a housing defining a receptacle for the component and a channel system for a fluid. The channel system runs from an inlet via a nozzle and via a cavity to an outlet. The housing comprises a wall structure with an inner surface forming an impact surface situated opposite a nozzle mouth and an outer surface serving as part of the receptacle.

9 Claims, 3 Drawing Sheets

(56) References Cited

U.S. PATENT DOCUMENTS

| | | | |
|---|---|---|---|
| 8,169,779 B2* | 5/2012 | Le .................. | H01L 23/4735 165/104.33 |
| 9,247,672 B2* | 1/2016 | Mehring ............ | H05K 7/20 |
| 2008/0060792 A1 | 3/2008 | Berger et al. ........ | 165/80.4 |
| 2009/0032937 A1* | 2/2009 | Mann ................ | H01L 23/4735 257/712 |
| 2009/0090490 A1* | 4/2009 | Yoshida ............ | H01L 23/4735 165/104.33 |
| 2010/0091457 A1* | 4/2010 | Krause .............. | H01L 23/473 361/689 |
| 2014/0301031 A1* | 10/2014 | Louvar .............. | G06F 1/185 361/679.31 |
| 2015/0043164 A1 | 2/2015 | Joshi ................ | 361/699 |
| 2016/0183409 A1 | 6/2016 | Zhou ................ | 361/699 |

FOREIGN PATENT DOCUMENTS

| | | | | |
|---|---|---|---|---|
| DE | 10 2010 043 904 | | 11/2010 | ........ H01L 23/473 |
| DE | 10 2011 101 302 | | 5/2011 | ........... H05K 7/20 |
| DE | 102010043904 | A1 | 6/2011 | ........ H01L 23/367 |
| DE | 102011101302 | A1 | 11/2012 | ............ B22F 5/10 |
| DE | 20 2013 012 008 | | 9/2013 | ........... H05K 7/20 |
| DE | 202013012008 | U1 | 12/2014 | ........ H01L 23/473 |

* cited by examiner

TEMPERATURE-CONTROL UNIT FOR AN ELECTRONIC COMPONENT

CROSS-REFERENCE TO RELATED APPLICATIONS

This application claims priority to DE Application No. 10 2016 214 959.8 filed Aug. 11, 2016, the contents of which are hereby incorporated by reference in their entirety.

TECHNICAL FIELD

The present disclosure relates to heat and temperature control. The teachings thereof may be embodied in temperature-control units for electronic components.

BACKGROUND

A temperature-control unit is described in US 2008/0060792 A1. Said cooling device consists of a housing which can be placed for example onto an electronic component that is to be cooled. The surface to be cooled of this electronic component forms, together with the housing, a cavity into which a cooling fluid consisting of a liquid and an admixed gas can be introduced. Use is made in this case of a nozzle which is directed towards the surface to be cooled of the component. The fluid can exit the temperature-control unit again through an outlet.

SUMMARY

Some embodiments of a temperature control unit may include a housing in which a receptacle for the electronic component and a channel system for a fluid, in particular a cooling fluid. The channel system runs from an inlet via a nozzle and via a cavity to an outlet. The cooling fluid is thereby guided through the nozzle. In this disclosure, a nozzle may be any type of supply line to the cavity, with which the cooling fluid can be injected in a directed manner into the cavity. As described herein, in accordance with its intended use in the cavity, a fluid may be guided through the nozzle to the surface, whose temperature is to be controlled, of the component, wherein sealing has to occur between the housing of the temperature-control device and the component. At this location, sealing problems can arise.

Some embodiments may include a temperature-control unit for electronic components (15) having a housing (20) in which a receptacle (16) for an electronic component (15) and a channel system for a fluid are provided. The channel system runs from an inlet (12) via a nozzle (24) and via a cavity (23) to an outlet (13). The housing (20) has a wall structure (19), the inner wall surface of which forms an impact surface (22) situated opposite a nozzle mouth (25) of the nozzle (24), and the outer wall surface of which is designed as part of the receptacle (16).

In some embodiments, a cross section, situated parallel to the wall structure (19), of the cavity (23) corresponds to a heat transfer surface which is defined by an outer boundary of the receptacle.

In some embodiments, the wall structure has a wall thickness of at most 1 mm, at most 0.9 mm, and/or at most 0.8 mm.

In some embodiments, an impact structure (26) on the impact surface (22) is provided opposite the nozzle mouth (25).

In some embodiments, a plurality of receptacles (16) with a plurality of associated cavities (23), nozzles (24), and impact surfaces (22) are provided in the housing (20).

In some embodiments, the plurality of nozzles (24) are provided with nozzle mouths (25) having at least two different cross-sectional areas.

In some embodiments, a plurality of cavities (23) are connected to a common inlet (12) and/or to a common outlet (13).

In some embodiments, the receptacle has a positioning aid (17).

In some embodiments, the receptacle is provided with a thermally conductive material (29).

In some embodiments, in a cavity, a plurality of nozzles (24) with a plurality of nozzle mouths (25) are provided for one and the same impact surface (22).

In some embodiments, said unit is of one-piece design.

Some embodiments may include methods for the production of a temperature-control unit as described above, characterized in that an additive manufacturing method is used for production.

In some embodiments, the temperature-control unit is produced together with a supporting structure (21) for the additive manufacturing method, wherein, following the production of the temperature-control unit, the supporting structure (21) remains connected to the temperature-control unit.

In some embodiments, CAD data for describing the temperature-control unit are generated in a computer C, wherein, in order to determine the geometry of the at least one receptacle (16), a database D containing the geometry data of the electronic components (15) whose temperature is to be controlled is provided.

In some embodiments, data relating to the cooling requirement or heating requirement of the electronic components are also stored in the database D, and the cross-sectional area of the at least one nozzle mouth (25) is calculated from said data.

BRIEF DESCRIPTION OF THE DRAWINGS

Further details of the disclosure are explained herein below on the basis of the drawings. Identical or corresponding elements of the drawing are denoted in each case by the same reference signs, and will thus be discussed multiple times only where differences exist between the individual figures. In the drawings.

DETAILED DESCRIPTION

Figure 1:
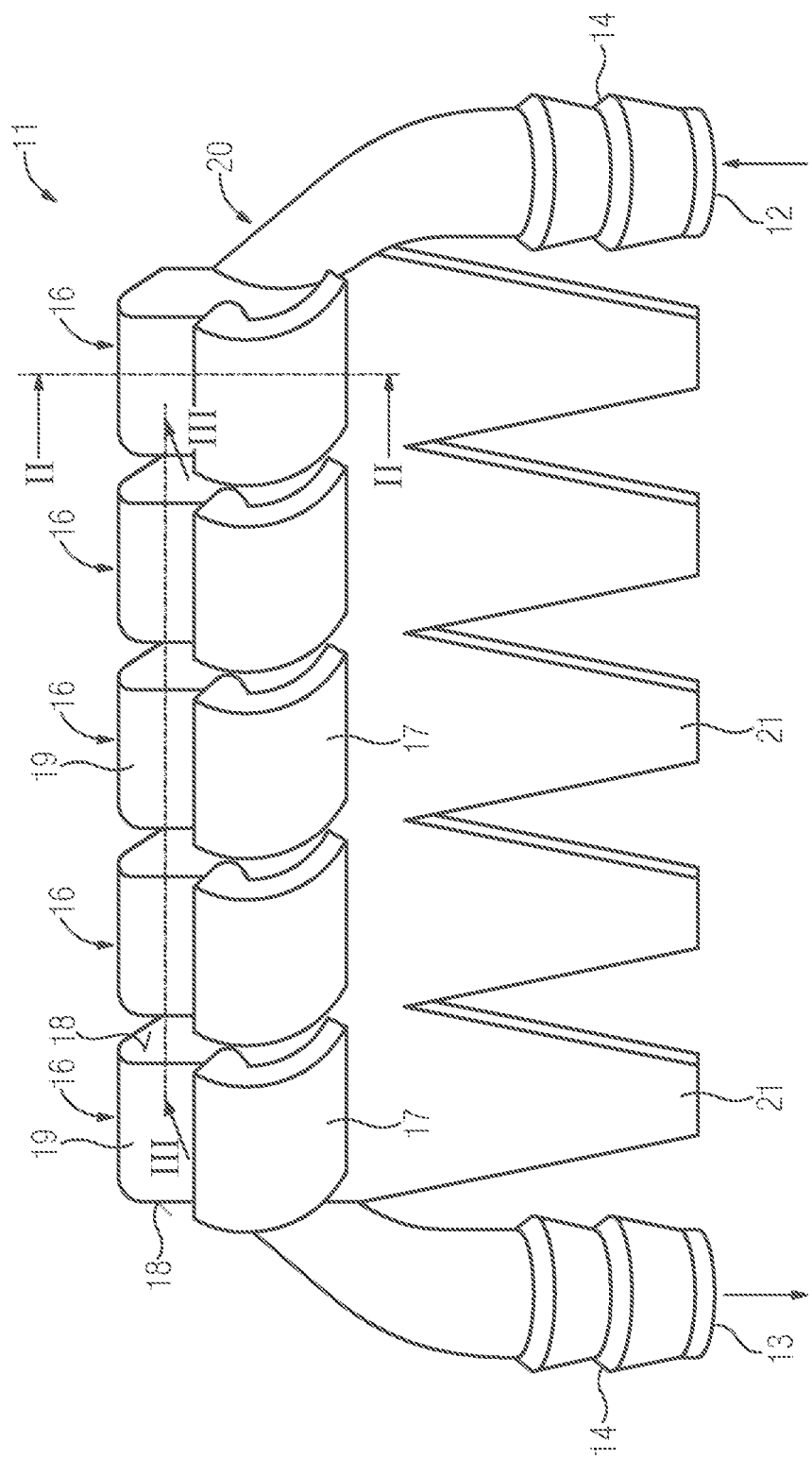
FIG. 1 shows an exemplary embodiment of the temperature-control unit according to the teachings of the present disclosure in a three-dimensional illustration.

Temperature control may include either or both cooling and heating. Cooling may be appropriate during the operation of electronic components, to remove the heat generated. Heating may be appropriate to bring an electronic component up to a required working temperature prior to start-up.

The teachings of the present disclosure may be embodied in a temperature-control unit for electronic components, which unit can be assembled reliably during operation and easily. Furthermore, some embodiments may include a method for the production of such a temperature-control unit, with which economical and flexible production of the temperature-control unit is possible.

In some embodiments, the temperature-control unit includes a housing with a wall structure, the inner wall surface of which forms an impact surface situated opposite a nozzle mouth of the nozzle, and the outer wall surface of which is part of the receptacle. In some embodiments, said wall surface leads to the cavity being situated completely inside the housing or, in other words, being closed off from the surroundings of the housing apart from the inlet and the outlet. Thus, it is only possible for the fluid to pass into the cavity via the inlet and to exit said cavity via the outlet, as a result of which the requirements for sealing are advantageously lowered.

This simplifies the assembly of the temperature-control unit and improves reliability with regard to sealing. Even in the case of component tolerances arising for the temperature-control unit and the electronic component, reliable sealing of the cavity may be improved. Since the outer wall surface is designed as part of the receptacle, the electronic component can exchange heat directly with the temperature-control unit. In this case, the thermal capacity of the wall structure is available, wherein an exchange of heat with the fluid takes place at the inner wall surface.

Consequently, a relatively high cooling performance or heating performance can be realized. The nozzle guides the fluid to the inner wall surface to assist the exchange of heat. Electronic components are manufactured in various standardized formats. Here, the need to install the electronic components and requisite thermal dissipation (cooling) are taken into consideration. The receptacle may be formed such that standardized electronic components accurately fit therein and are fixed in their position. Integrated in the receptacle may be, for example, a pressing mechanism which presses the electronic component onto the outer wall surface of the wall structure. As a result, the heat transfer can be improved.

In some embodiments, a cross section situated parallel to the wall structure, of the cavity may correspond to a cooling surface defined by the outer boundary of the receptacle. This may improve distribution of the fluid, via the nozzle, on the inner wall surface completely opposite the surface to be cooled of the electronic component. This improves the efficiency of the temperature control, since the wall structure has no subregions which are outside the surface to be cooled of the electronic component. Conversely, an exchange of heat is achieved between the wall structure and the component whose temperature is to be controlled, over the entire cooling surface, provided for this purpose, of the electronic component.

The outer boundary of the receptacle may be designed in different ways. Here, it can simply be the edge of the heat transfer surface. Said edge may be formed by a shoulder. The shoulder at the heat transfer surface may spring back, this having the advantage that the electronic component can project beyond the heat transfer surface for example for tolerance reasons. The shoulder may also constitute a projection such that a lateral guide is formed for the electronic component in order to facilitate its positioning.

In some embodiments, the wall structure may have a wall thickness of at most 1 mm, at most 0.9 mm, or at most 0.8 mm. Reduced material consumption also improves the heat transfer rate between the inner wall surface and the outer wall surface. Furthermore, the temperature-control unit may be as light as possible.

In some embodiments, there is an impact structure, in particular an impact cone, on the impact surface opposite the nozzle mouth. Because said impact structure is arranged opposite the nozzle mouth, it provides a uniform distribution of the fluid on the impact surface and thereby prevents turbulence. The fluid strikes a tip of the impact structure and is deflected by the lateral surface thereof. In this disclosure, the term impact structure means a structure which, facing toward the nozzle mouth, tapers to a point and the cross section of which (situated parallel to the impact surface) increases toward the impact surface and thus contributes to a deflection of the fluid. The impact structure may be formed for example by an impact cone or by an impact pyramid.

In some embodiments, there is a plurality of receptacles with a plurality of associated cavities, nozzles, and impact surfaces in the housing. The temperature-control unit may thus be used for simultaneously cooling a plurality of electronic components, wherein, for each of these, a common inlet and a common outlet may be used. This allows the expenditure for a seal at the inlet and at the outlet to be reduced, whereby the reliability of the temperature-control unit further increases and the assembly expenditure further decreases.

In some embodiments, the temperature-control unit is matched to the geometric conditions of an assembly having a plurality of electronic components to be cooled. The temperature-control unit is placed onto the assembly and connected to it, so the electronic components are simultaneously positioned in the receptacles provided therefor.

In some embodiments, there is a plurality of nozzles with nozzle mouths having at least two different cross-sectional areas. This measure may allow the temperature-control requirement, in particular the cooling requirement, of various electronic components to be taken into consideration such that the temperature-control performance can be controlled by the quantity of the fluid supplied. The larger the cross-sectional area of the nozzle mouth is, the greater the volume flow of the fluid, and thus the temperature-control performance (in particular cooling performance) at the associated impact surface, also has to be.

In some embodiments, the receptacle for the electronic component may include a positioning aid. Said positioning aid can act geometrically such that positive locking is achieved between the receptacle and the electronic component in question. As a result, the position of the electronic component is fixed accurately. As already mentioned, it is also possible to use elements for increasing the contact pressure of the component on the outer wall surface on the temperature-control unit, with the result that positive locking is achieved between the receptacle and the electronic component. The positive locking can also be used to keep the electronic component in its position, but also serves for improved heat transfer.

In some embodiments, the receptacle of the temperature-control unit may include a soldering material or with some other thermally conductive material. This ensures the availability of a highly thermally conductive material. If the component is soldered to the temperature-control unit via the soldering material, this may give rise to an especially highly thermally conductive connection. Even in the case of positive locking between the electronic component and the receptacle, the thermally conductive material can assist heat transfer since it is flexible and can compensate for tolerances resulting from deformation.

In some embodiments, in a cavity, there is a plurality of nozzles with a plurality of nozzle mouths for a single impact surface. Consequently, it is possible to also take relatively large electronic components in the temperature-control unit into consideration by way of a suitably formed receptacle. The relatively high requirement, associated with the size, for an exchange of heat is ensured in that the fluid is supplied via a plurality of nozzles, whereby a relatively large cross section is available overall for the guidance of the fluid. Moreover, it is possible to distribute the fluid in a uniform manner on the relatively large impact surface via a plurality of nozzles. A structural element which provides greater flexibility in the adaptation and design of the temperature-control unit is thereby advantageously available.

In some embodiments, the temperature-control unit is of one-piece design. As a result, particularly high reliability with regard to the tightness of the temperature-control unit may be achieved. Furthermore, particularly compact designs can be realized.

In some embodiments, to be able to produce a one-piece design in an economical manner, an additive manufacturing method is used for the production of the temperature-control unit. Depending on the material and requirements of the temperature-control unit, various manufacturing methods come into consideration for this purpose. In the context of the present disclosure, the term additive manufacturing methods means methods in which the material from which a structural part is to be produced is added to the structural part as it is being formed. In this case, the structural part is formed already in its final shape or at least approximately in this shape. The structural material may be in powder form or liquid, wherein the material for producing the structural part is chemically or physically consolidated by the additive manufacturing method.

To produce the structural part, data describing the structural part (CAD model) are prepared for the selected additive manufacturing method. For creating instructions for the manufacturing system, the data are converted into data of the structural part that have been matched to the manufacturing method, in order that the suitable process steps for the successive production of the structural part can be carried out in the manufacturing system. The data are prepared such that the geometric data for the layers (slices) of the structural part that are respectively to be produced are available, this also being referred to as slicing.

Additive manufacturing may include selective laser sintering (SLS), selective laser melting (SLM), electron beam melting (EBM), laser metal deposition (LMD), and gas dynamic cold spray (GDCS). These methods and others are suitable for the processing of metallic materials in the form of powders with which structural parts can be produced.

In the case of SLM, SLS, and EBM, the structural parts are produced in layers in a powder bed. These methods may be referred to as powder-bed-based additive manufacturing methods. In each case, a layer of the powder is created in the powder bed and is then fused or sintered locally, by way of the energy source (laser or electron beam), in those regions in which the structural part is to be formed. The structural part is thus created step-by-step in layers and, after completion, can be removed from the powder bed.

In the case of LMD and GDCS, the powder particles are fed directly to the surface on which material is to be applied. In the case of LMD, the powder particles are fused by a laser directly at the application point on the surface and in the process form a layer of the structural part to be created. In the case of GDCS, the powder particles are subjected to intense acceleration such that, with simultaneous deformation, they remain adhered to the surface of the structural part, primarily on account of their kinetic energy.

In both GDCS and SLS, the powder particles are not completely fused. In the case of GDCS, fusing takes place at most in the peripheral region of the powder particles which, on account of the strong deformation on their surface, are able to undergo melting. In the case of SLS, when selecting the sintering temperature, care is taken to ensure that this is below the melting temperature of the powder particles. By contrast, in the case of SLM, EBM, and LMD, the introduction of energy is deliberately of such a magnitude that the powder particles are completely fused.

The temperature-control unit may be produced from a metallic material, since said metallic material ensures good thermal conduction properties. In such embodiments, the temperature-control unit may be produced simply by means of SLM and EBM.

In some embodiments, the temperature-control unit to be produced together with a supporting structure for the additive manufacturing method. Following the production of the temperature-control unit, the supporting structure remains connected to the temperature-control unit. In additive manufacturing methods, supporting structures are created together with the structural part to be produced, to protect the latter from distortion and to produce structural part regions that do not lie on the structural panel better. Normally, these supporting structures are removed after completion of the structural parts. If the supporting structures are left on the temperature-control unit, they are available for thermal dissipation. This allows a cooling performance of the temperature-control unit to be improved, since heat can be dissipated to the surroundings via the supporting structures. This gives rise for example to a buffer during overload operation or peak-load operation of the electronic components to be cooled.

In some embodiments, CAD data describe the temperature-control unit to be generated in a computer by means of a suitable CAD program installed on the computer. To determine the geometry of the at least one receptacle, a database containing the geometry data of the electronic components to be cooled is provided. This may speed up the CAD process for determining the geometry of the temperature-control unit to be produced, since the receptacles have to be matched to the geometry of the electronic components. Said geometry may be already known and can be uploaded from the database.

At the same time, the computer can take into consideration structural requirements which apply to the temperature-control unit (for example minimum wall thicknesses for the housing, minimum cross sections for the inlet and the outlet in dependence on the required fluid, minimum distances of the individual receptacles from one another, etc.). The CAD data of the temperature-control unit that are generated in the computer are then, for the purpose of production, passed on to a system for the additive production of the temperature-control unit, wherein, for the purpose of production, a production data set has to be generated from the CAD data. The production data set consists of data which describe the temperature-control unit in the individual layers to be produced.

In some embodiments, data relating to the cooling requirement of the electronic components may also be stored in the database, and the cross-sectional area of the at least one nozzle mouth may be calculated from said data. In this case, consideration is taken of the relationship whereby the cooling performance or heating performance of the temperature-control unit at a specific receptacle depends directly on the cross section of the nozzle mouth. The laws which apply in this regard are likewise taken into consideration by the computer.

FIG. 1 illustrates a temperature-control unit 11 which can be used as a cooler or as a heater. For temperature control, a fluid is fed into the temperature-control unit 11 via an inlet 12 and exits the temperature-control unit 11 again via an outlet 13. The inlet 12 and outlet 13 are designed as pipe connecting pieces onto which hoses for the fluid can be plugged. For a firm seat, ridges 14 are provided. The connections may also be designed for fitting concepts other than hose fitting. In the following text, it will be assumed without loss of generality that the temperature-control unit is used as a cooler. This covers the application in which electronic components 15 (cf. FIG. 2) are to be cooled during their use.

The cooler according to FIG. 1 has five receptacles 16 in which components (not shown) can be held. To hold said components in the receptacles 16, positioning aids 17 in the form of spring elements are provided. The receptacles 16 have an outer boundary 18, said boundaries being formed by a descending shoulder and in this way determining the size of a wall structure 19, these being part of a housing 20 forming the cooler.

Figure 4:
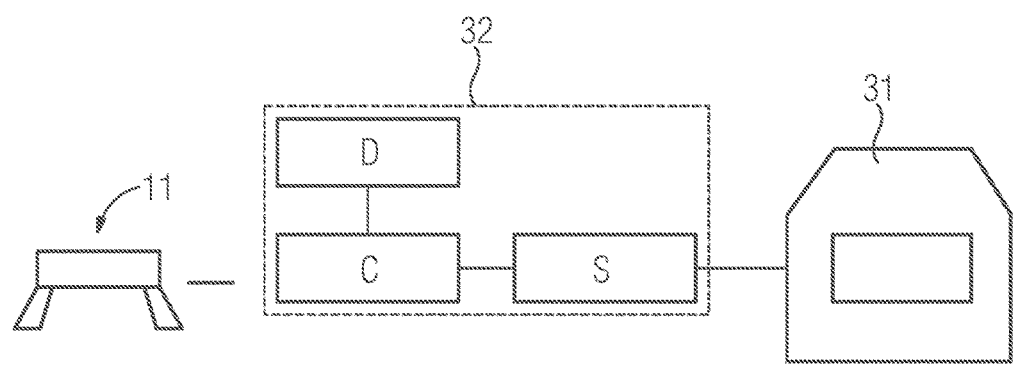

The cooling housing 20 was produced additively according to the method in FIG. 4. In FIG. 1, it is illustrated in the position for production, wherein the inlet 12 and the outlet 13 stand on the structural platform for the additive manufacturing method during production. Since the receptacles 16 span the structural platform (not shown) in a bridge-like manner, a supporting structure 21 acts on the receptacles 16 from below for each of the receptacles. Following production, the housing 20, together with the supporting structures 21, was separated off directly above the structural platform, wherein the supporting structures 21 remain on the housing to use both the thermal capacity of the additional material and the surface for thermal radiation. In another embodiment (not shown), it is also possible for the supporting structures 21 to be separated off to reduce the space requirement for the cooling housing 20.

The wall structures 19 form, together with the outer wall surfaces respectively visible behind the positioning aids in FIG. 1, part of the receptacles 16. The respectively inner wall surface of the wall structure 19 can be seen in FIG. 2. Said inner wall surface of the wall structure 19 forms, in the interior of the housing 20, impact surfaces 22 which constitute a part of cavities 23. Nozzles 24 open into these cavities 23 in such a manner that nozzle mouths 25 are directed toward the impact surfaces 22. A fluid, for example oil, water, or thermal fluids based on fluorinated organic compounds, and/or a gas, e.g., air, flowing through the nozzles 24 thus strikes the impact surface 22, wherein impact structures 26 in the form of impact cones are provided exactly opposite the nozzle mouths 25. Said structures divide the fluid jet striking thereon and distribute it uniformly over the impact surface 22.

Figure 2:
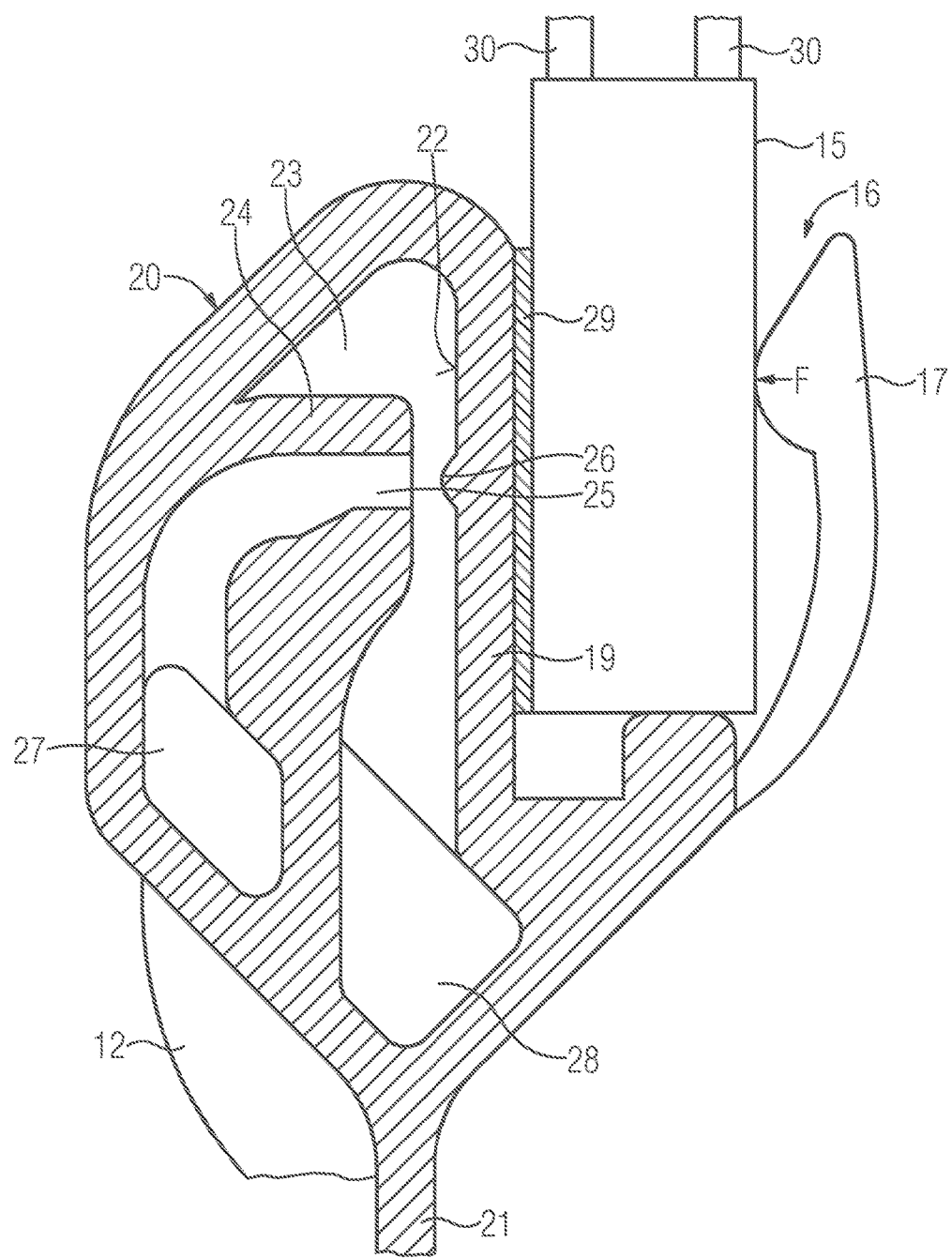
FIG. 2 shows the section II-II according to FIG. 1 with fitted electronic component.
Figure 3:
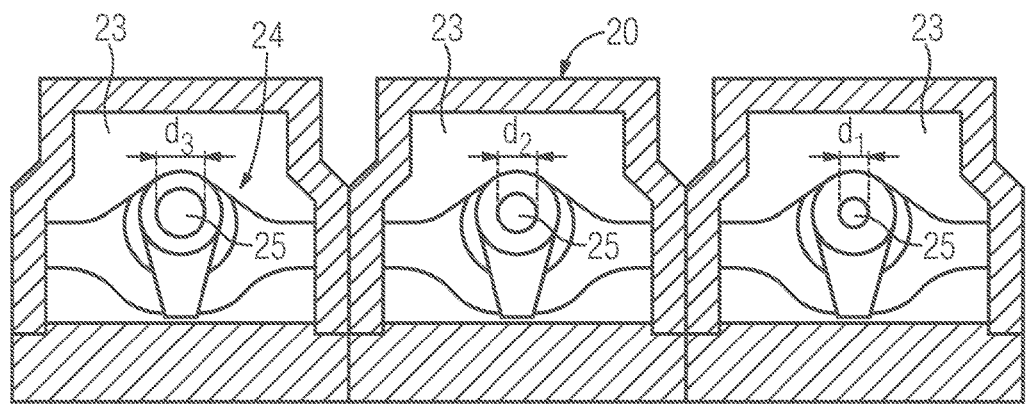
FIG. 3 shows the section III-III according to FIG. 1, and, FIG. 4 shows an exemplary embodiment of the method according to the teachings of the present disclosure as a block diagram.

The section II-II from FIG. 2 is plotted in FIG. 1. Through this, the structure of the receptacle and of the housing structure situated there behind, which are illustrated on the extreme right in FIG. 1, is illustrated. As can be seen in FIG. 3, however, the structure of the further receptacles and of the housing parts is analogous to that illustrated in FIG. 2. The only difference is in the cross section of the nozzle mouths 25, which are illustrated as circular in FIG. 3. Depending on the cooling/heating requirement, the nozzle mouths may be characterized by different diameters $d_1$, $d_2$, $d_3$, where $d_1$ is the smallest diameter and $d_3$ the largest. The impact surface 22 illustrated in FIG. 2 has been cut away in FIG. 3 and therefore cannot be seen.

It can furthermore be seen in FIG. 2 that the nozzles branch off from a common supply channel 27, wherein only one of the nozzles 24 can be seen in FIG. 2. The supply channel 27 and a discharge channel 28 extend exactly perpendicularly to the plane of the drawing, wherein the respective cavities 23 open into the discharge channel 28. The supply channel 27 is connected to the inlet 12, and the discharge channel 28 is connected to the outlet 13 (cf. FIG. 1) which is situated in front of the plane of the drawing and therefore not illustrated.

The component 15 is inserted into the receptacle 16 illustrated in FIG. 2. Consequently, the positioning aid 17 is bent outward, whereby a pressing force F, which acts in the direction of the wall structure 19, is generated. As a result, the component 15 is pressed. A layer composed of a thermally conductive material (for example a soldering material) 29 is provided between the component and the wall structure 19. Said layer may be applied (for example by way of coating) to the housing 20 prior to the insertion of the component 15.

In some embodiments, the thermally conductive material may be applied to the component 15 which, for this purpose, can for example be metallized prior to the application in particular of soldering material. The thermally conductive material 29 leads to improved thermal conduction into the cooler and may also be fused. This may take place at the same time as the formation of soldering connections (not shown) at contacts 30 of the component 15 if the temperature-control unit is premounted on the component 15. Instead of soldering material, some other thermally conductive material 29 (thermally conductive paste or highly thermally conductive adhesive) may also be used.

In the illustrated method example according to FIG. 4, a system 31 for selective laser melting is used to produce the temperature-control unit according to FIG. 1. Said system 31 is connected to a controller S which monitors the production of the temperature-control unit 11. For this purpose, the controller S receives a data set describing the temperature-control unit 11 from a computer C, which data set describes the temperature-control unit 11 in layers. The computer generates said data set from a CAD data set which is generated by CAD software and which describes the temperature-control unit 11.

This CAD data set, too, is generated from structural data of the temperature-control unit, wherein a database D is used to assist the generation of the CAD data set. Said database contains standard measurements of electronic components and also the performance data from which the cooling requirement can be derived. As a result, the geometry of the receptacles 16 (cf. FIG. 1) can be determined with little effort from the geometry of the electronic components to be cooled and by the selection of the diameters $d_1$, $d_2$, $d_3$ (cf. FIG. 3).

The individual modules C, D, S may be structurally separate from one another or, as indicated by the dash-dotted line 32, structurally combined, for example in a computer housing.

What is claimed is:

1. A temperature-control unit for electronic components, the unit comprising:
   a housing defining a receptacle for an electronic component and a channel system for a fluid;
   wherein the channel system runs from an inlet to multiple nozzles spraying into and a cavity with an outlet;

wherein the housing comprises a wall structure having an inner wall surface forming an impact surface situated opposite a respective nozzle mouth of each of the multiple nozzles and an outer wall surface serving as part of the receptacle;

wherein the receptacle comprises a positioning guide with a spring element; and wherein at least two of the multiple nozzles have respective nozzle mouths with different cross-sectional areas.

2. The temperature-control unit as claimed in claim 1, wherein a cross section situated parallel to the wall structure of the cavity corresponds to a heat transfer surface defined by an outer boundary of the receptacle.

3. The temperature-control unit as claimed in claim 1, wherein the wall structure has a wall thickness of at most 1 mm.

4. The temperature-control unit as claimed in claim 1, further comprising an impact structure on the impact surface opposite the respective nozzle mouths.

5. The temperature-control unit as claimed in claim 1, further comprising a plurality of receptacles with a plurality of associated cavities, nozzles, and impact surfaces in the housing.

6. The temperature-control unit as claimed in claim 5, wherein the plurality of cavities are connected to at least one of a common inlet or to a common outlet.

7. The temperature-control unit as claimed in claim 1, further comprising a positioning aid in the receptacle.

8. The temperature-control unit as claimed in claim 1, wherein the receptacle comprises a thermally conductive material.

9. The temperature-control unit as claimed in claim 1, wherein the unit comprises a single piece.

* * * * *